(12) United States Patent
Wei et al.

(10) Patent No.: US 8,936,986 B2
(45) Date of Patent: Jan. 20, 2015

(54) METHODS OF FORMING FINFET DEVICES WITH A SHARED GATE STRUCTURE

(71) Applicant: GLOBALFOUNDRIES Inc., Grand Cayman, KY (US)

(72) Inventors: Andy C. Wei, Queensbury, NY (US); Dae Geun Yang, Watervliet, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/797,117

(22) Filed: Mar. 12, 2013

(65) Prior Publication Data
US 2014/0273429 A1    Sep. 18, 2014

(51) Int. Cl.
*H01L 21/336*    (2006.01)
*H01L 29/40*    (2006.01)

(52) U.S. Cl.
CPC .................................. *H01L 29/401* (2013.01)

USPC ...... 438/283; 438/157; 438/176; 257/E21.637

(58) Field of Classification Search
USPC .................. 438/157, 176, 283; 257/E21.623, 257/E21.637
See application file for complete search history.

(56) References Cited

U.S. PATENT DOCUMENTS

2013/0187206 A1 *    7/2013    Mor et al. ..................... 257/288

* cited by examiner

*Primary Examiner* — Thanhha Pham
(74) *Attorney, Agent, or Firm* — Amerson Law Firm, PLLC

(57) ABSTRACT

In one example, the method disclosed herein includes forming a shared sacrificial gate structure above at least one first fin for a first type of FinFET device and at least one second fin for a second type of FinFET device, wherein the second type is opposite to the first type, and forming a first sidewall spacer around an entire perimeter of the sacrificial gate structure in a single process operation.

17 Claims, 14 Drawing Sheets

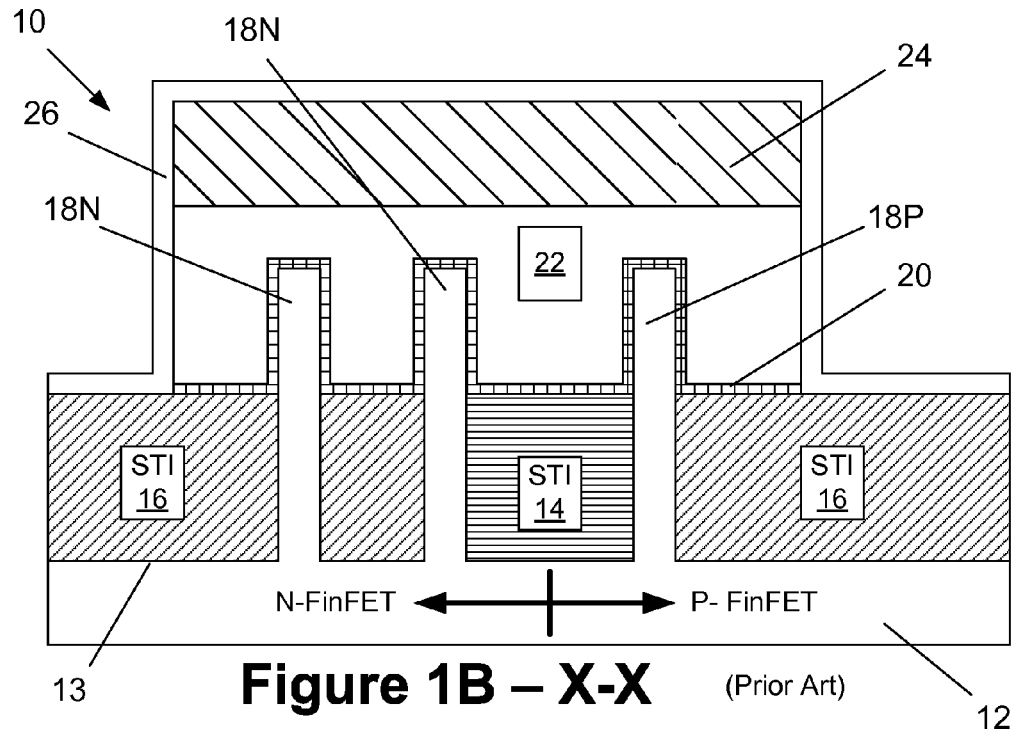
Figure 1B – X-X (Prior Art)
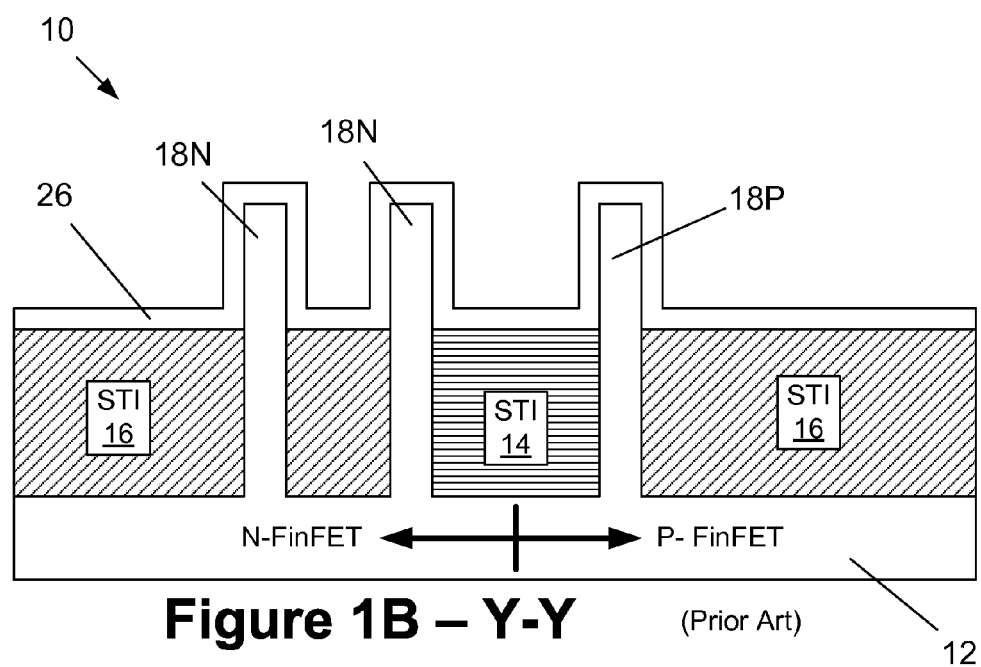
Figure 1B – Y-Y (Prior Art)

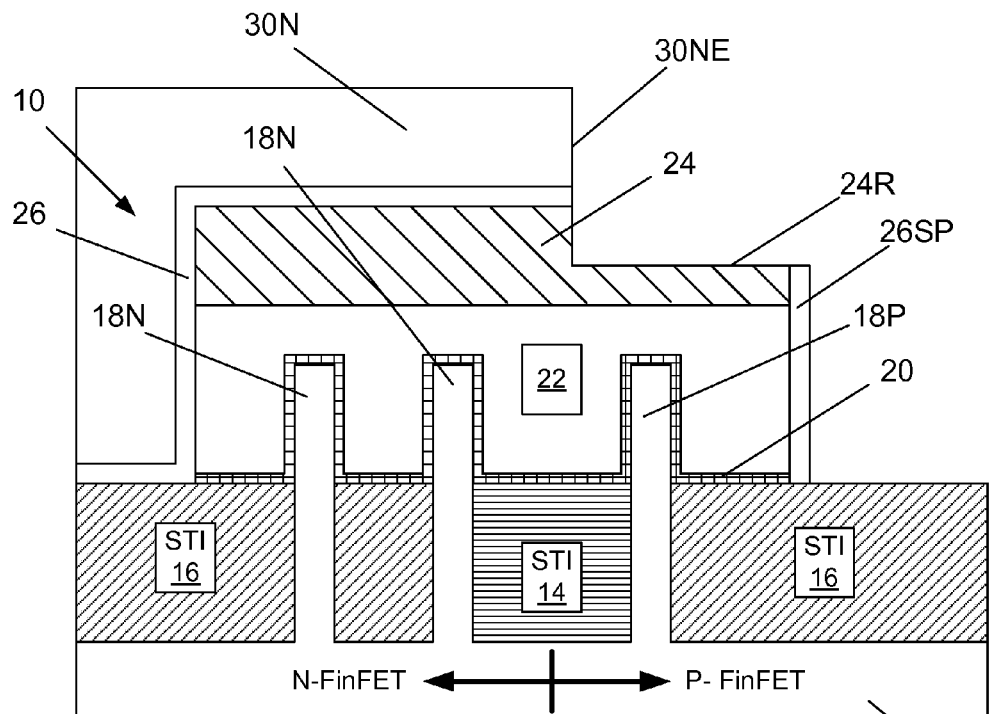
Figure 1C – X-X (Prior Art)
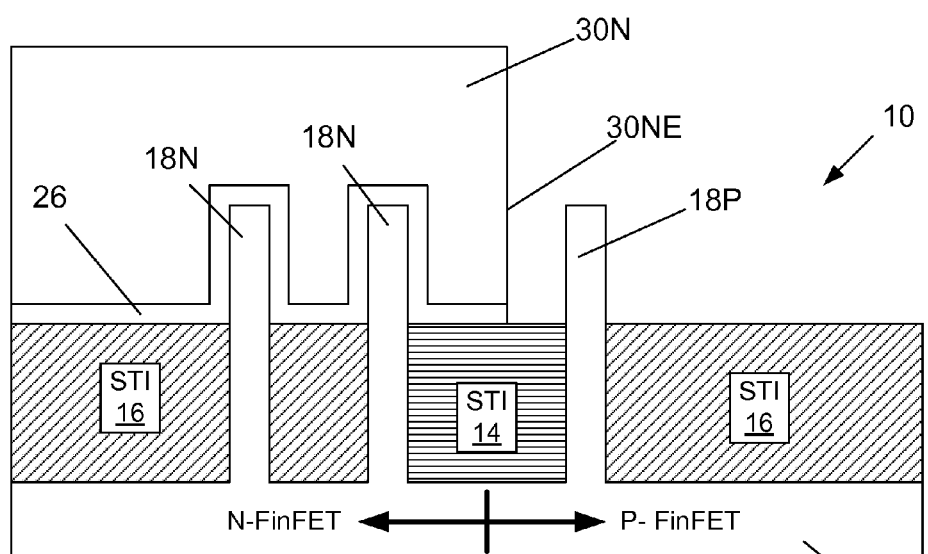
Figure 1C – Y-Y (Prior Art)

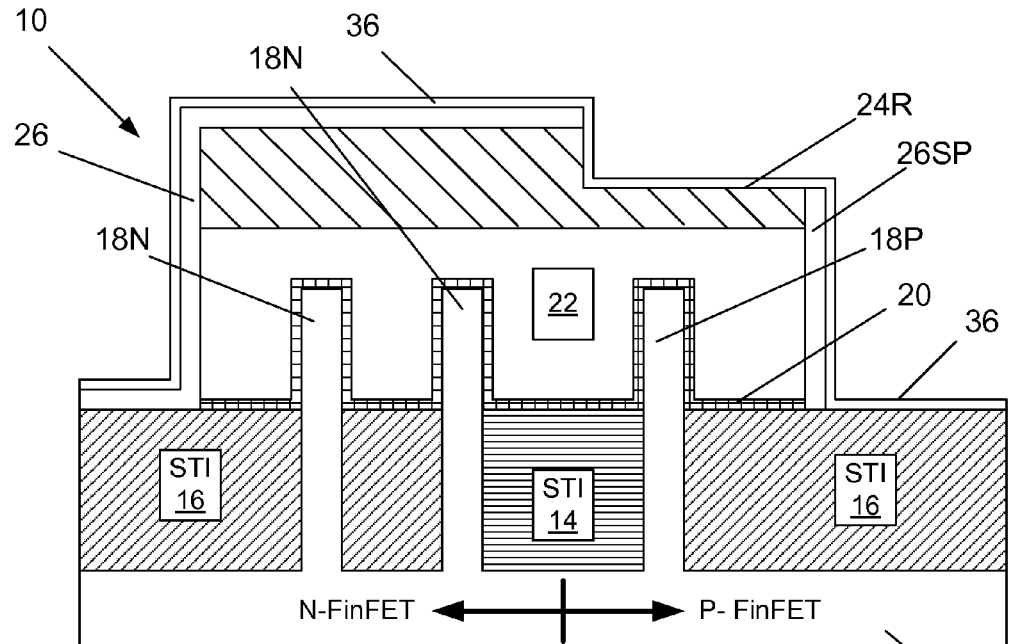
Figure 1D – X-X (Prior Art)
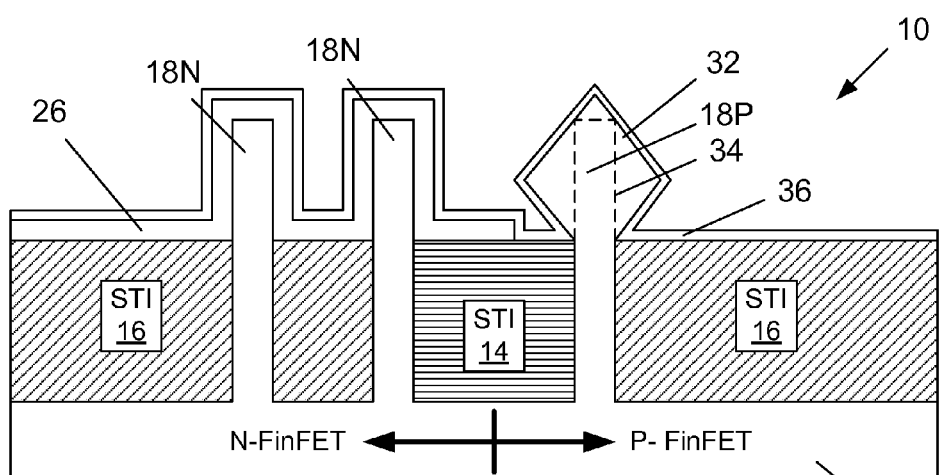
Figure 1D – Y-Y (Prior Art)

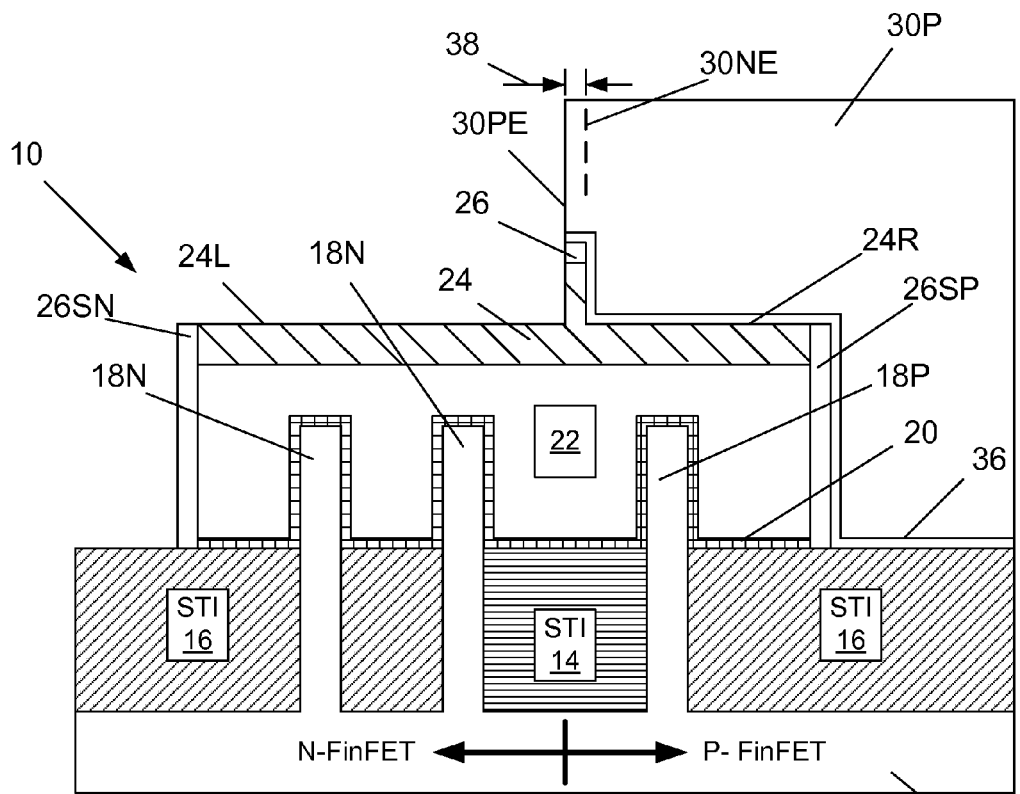
Figure 1E – X-X  (Prior Art)
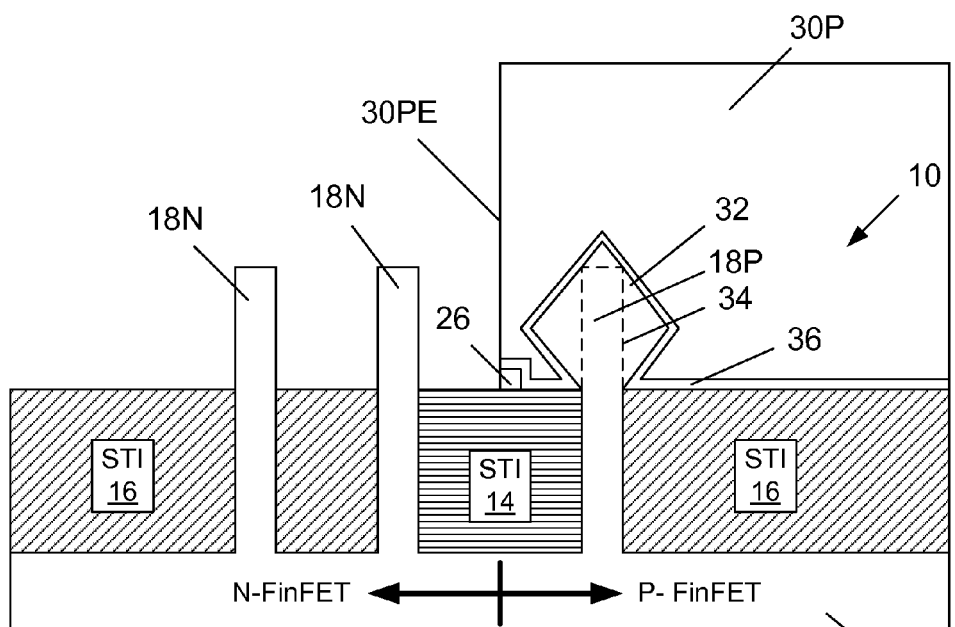
Figure 1E – Y-Y  (Prior Art)

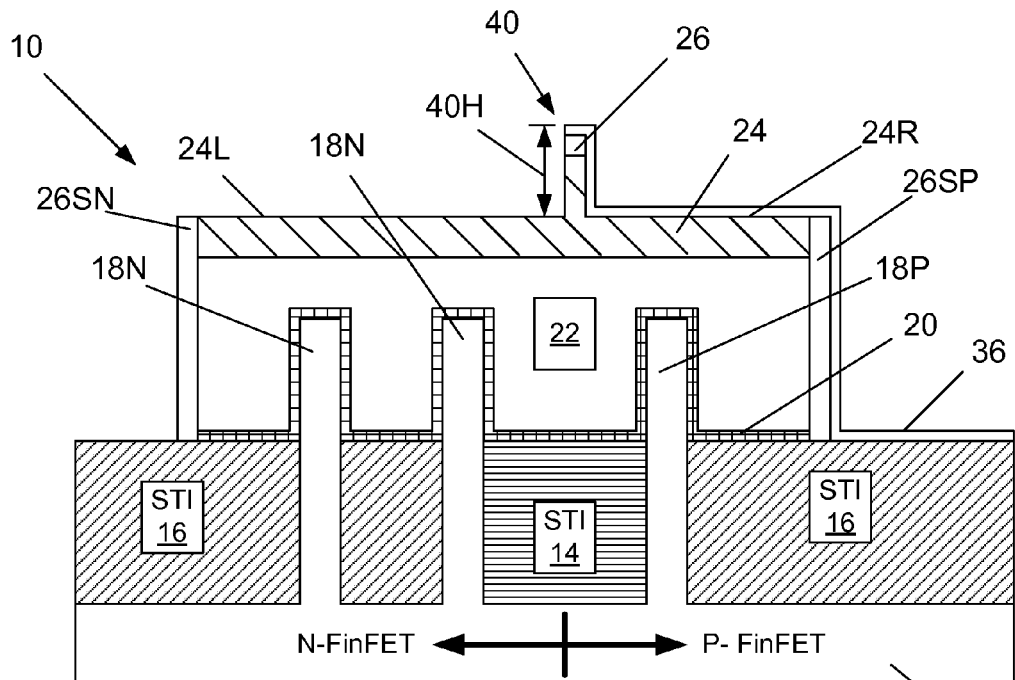
Figure 1F – X-X (Prior Art)
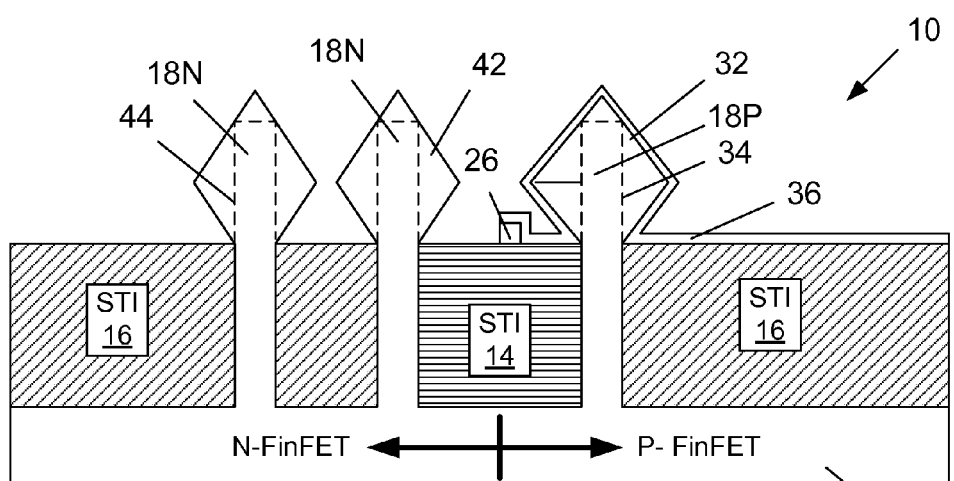
Figure 1F – Y-Y (Prior Art)

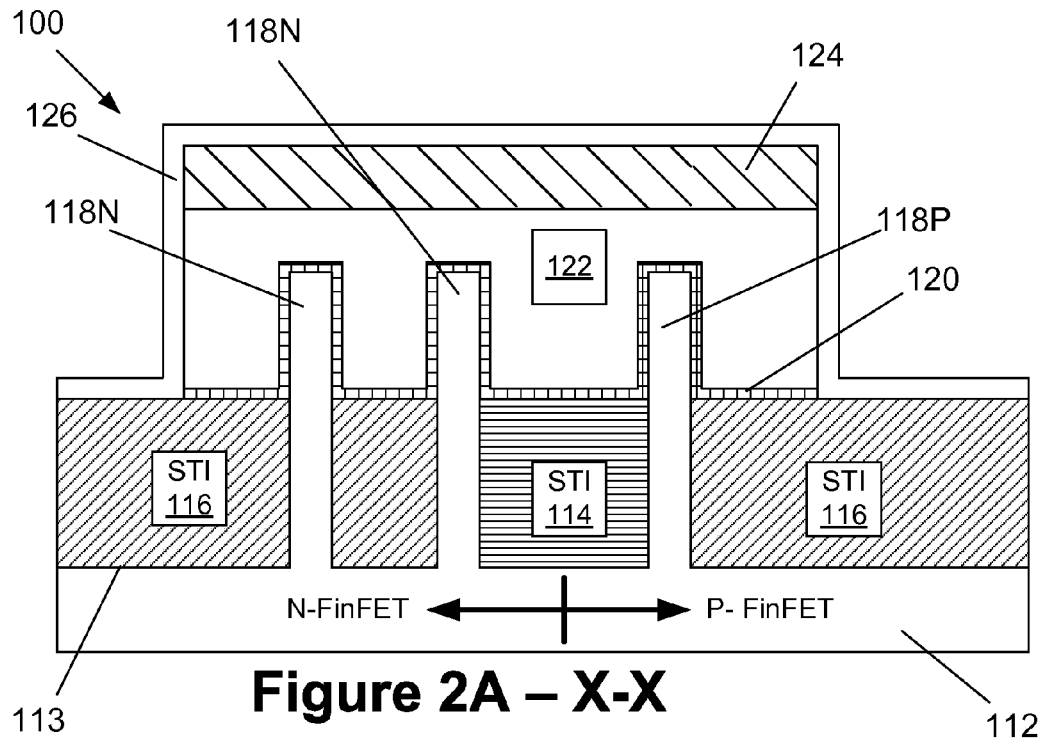
Figure 2A – X-X
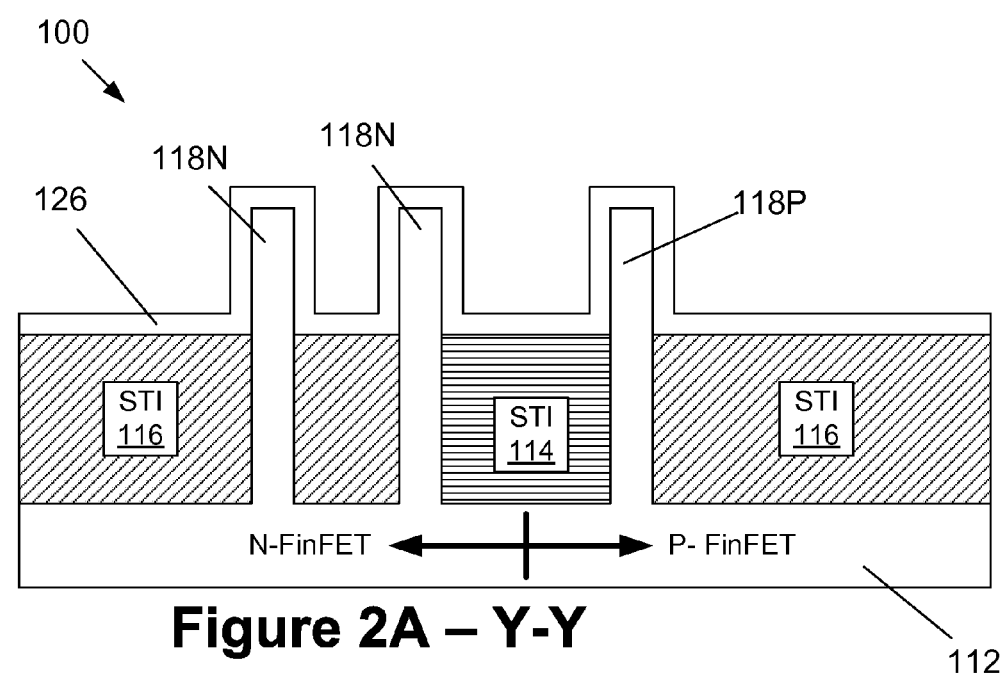
Figure 2A – Y-Y

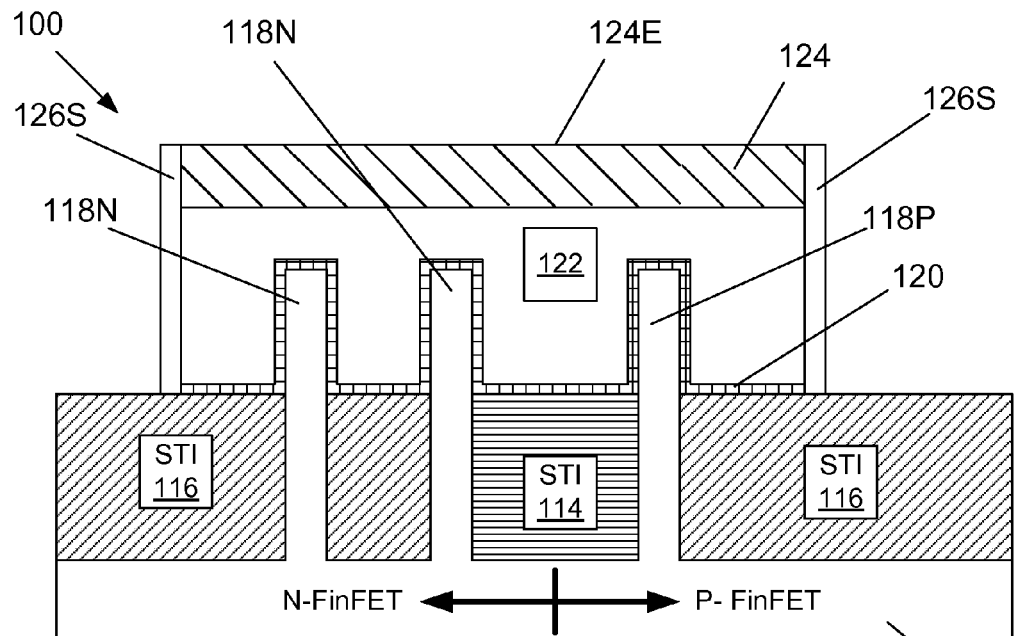
Figure 2B – X-X
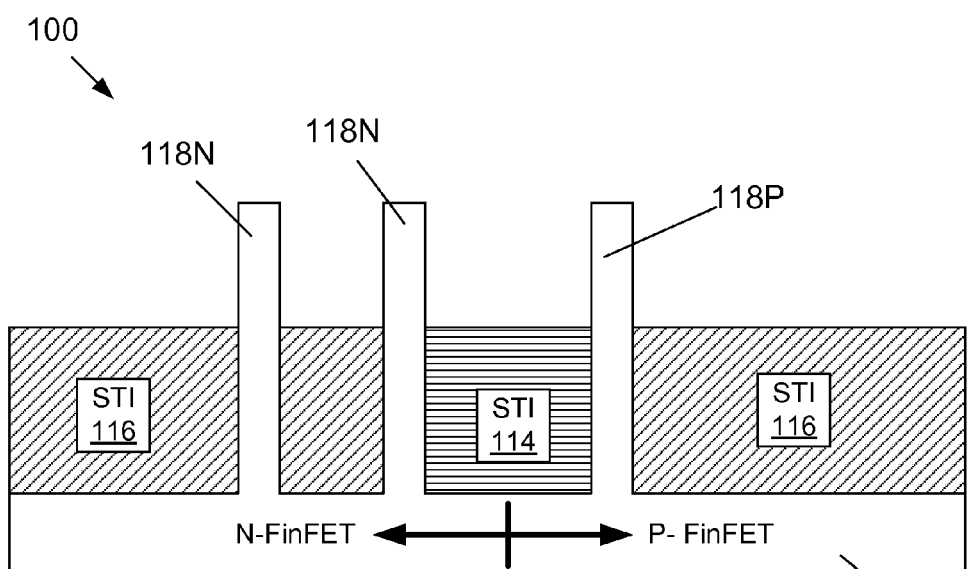
Figure 2B – Y-Y

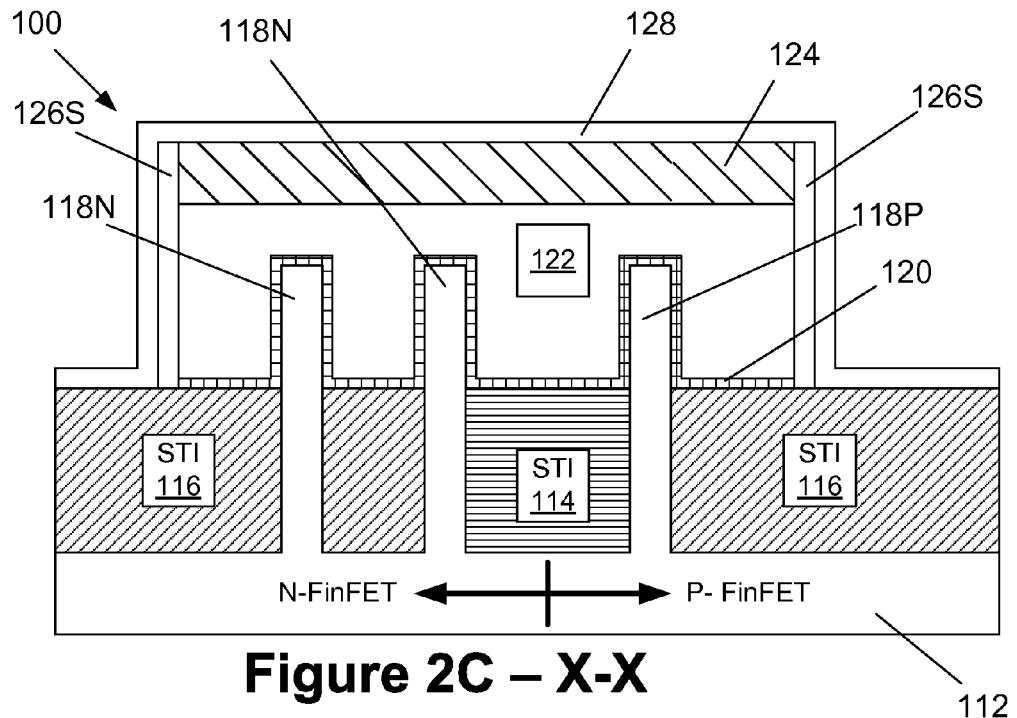
Figure 2C – X-X
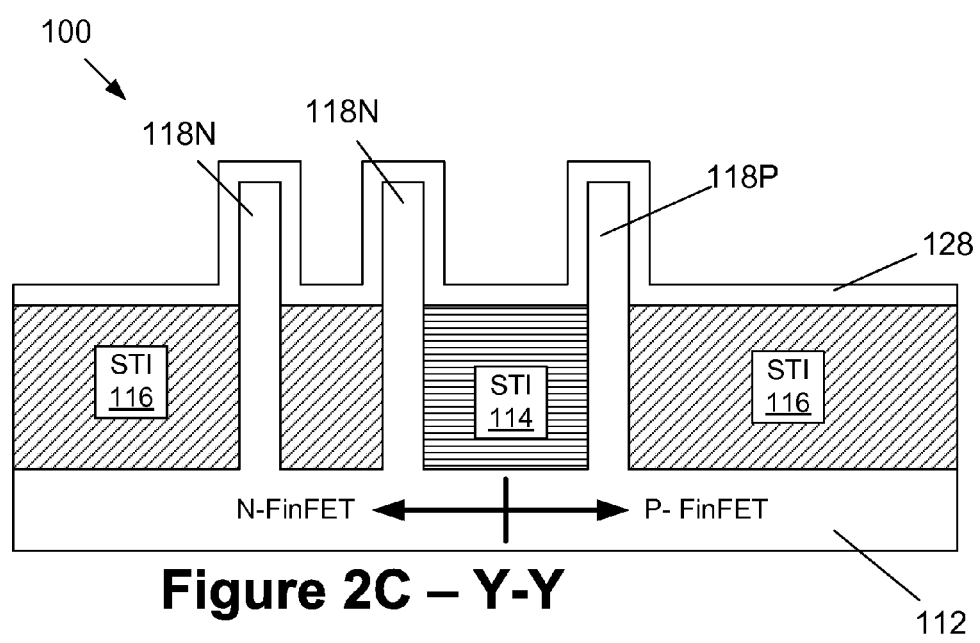
Figure 2C – Y-Y

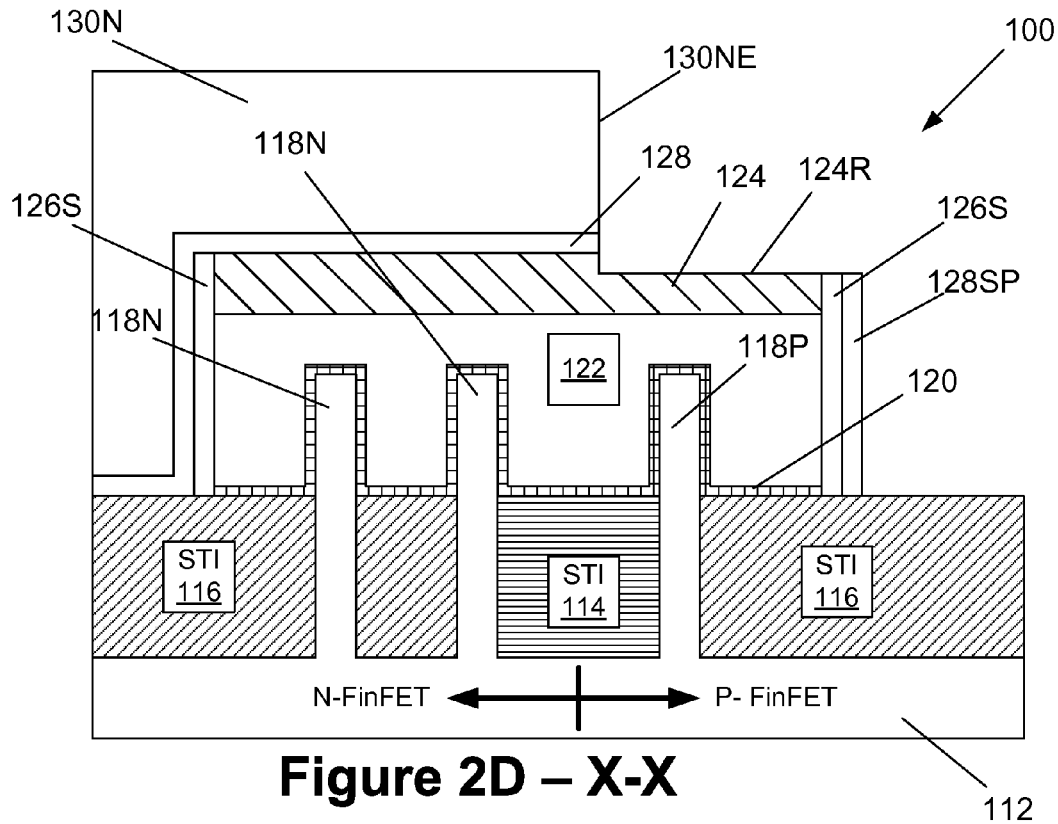
Figure 2D – X-X
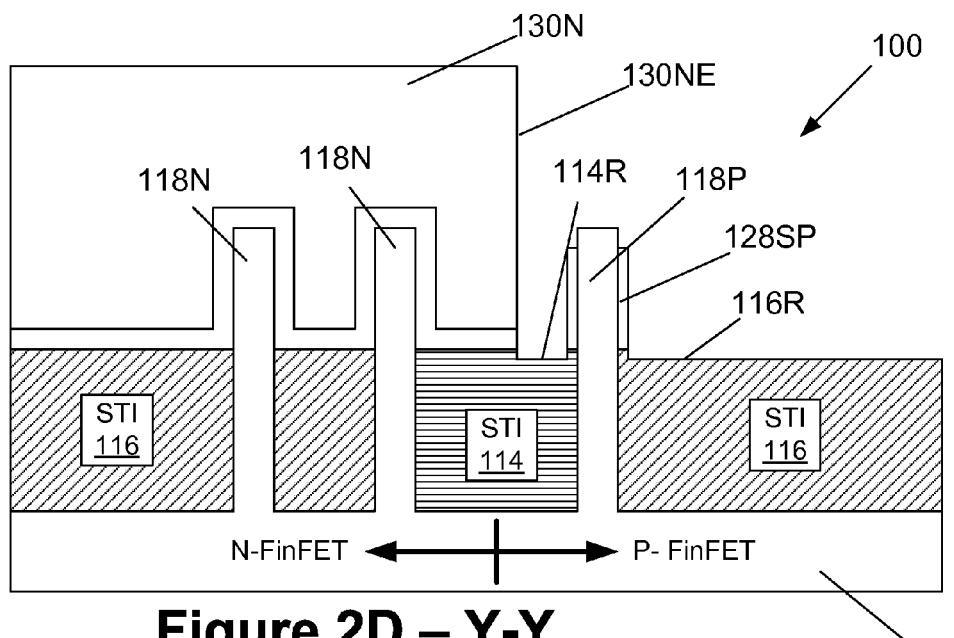
Figure 2D – Y-Y

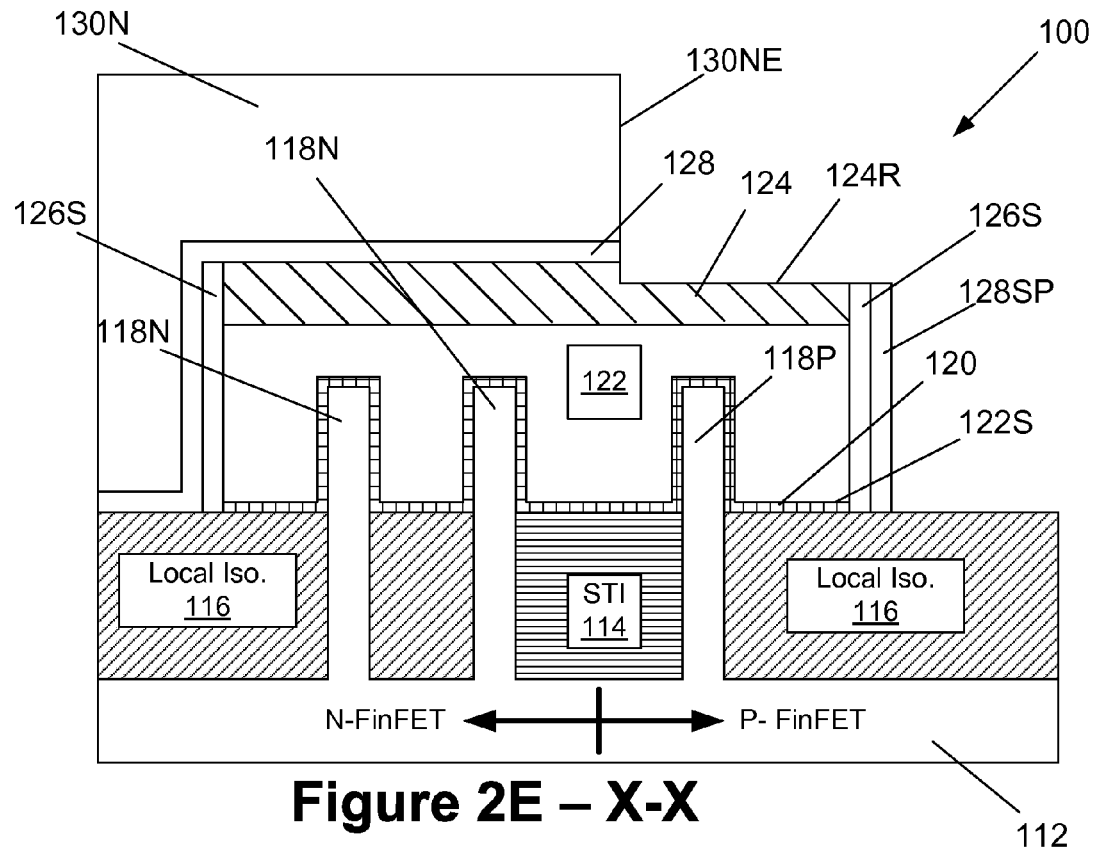
Figure 2E – X-X
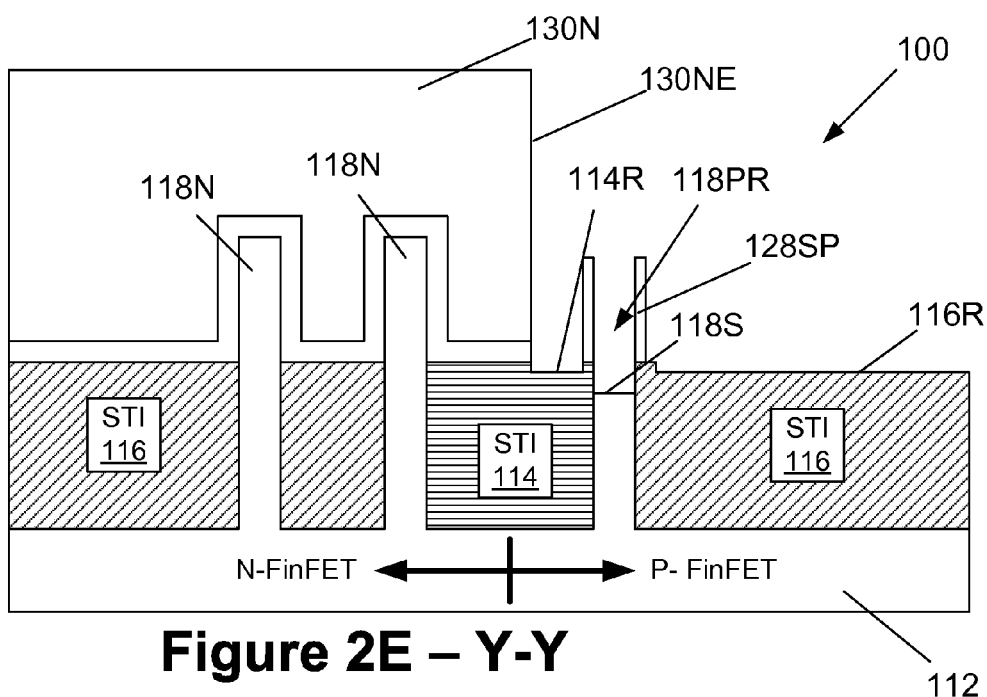
Figure 2E – Y-Y

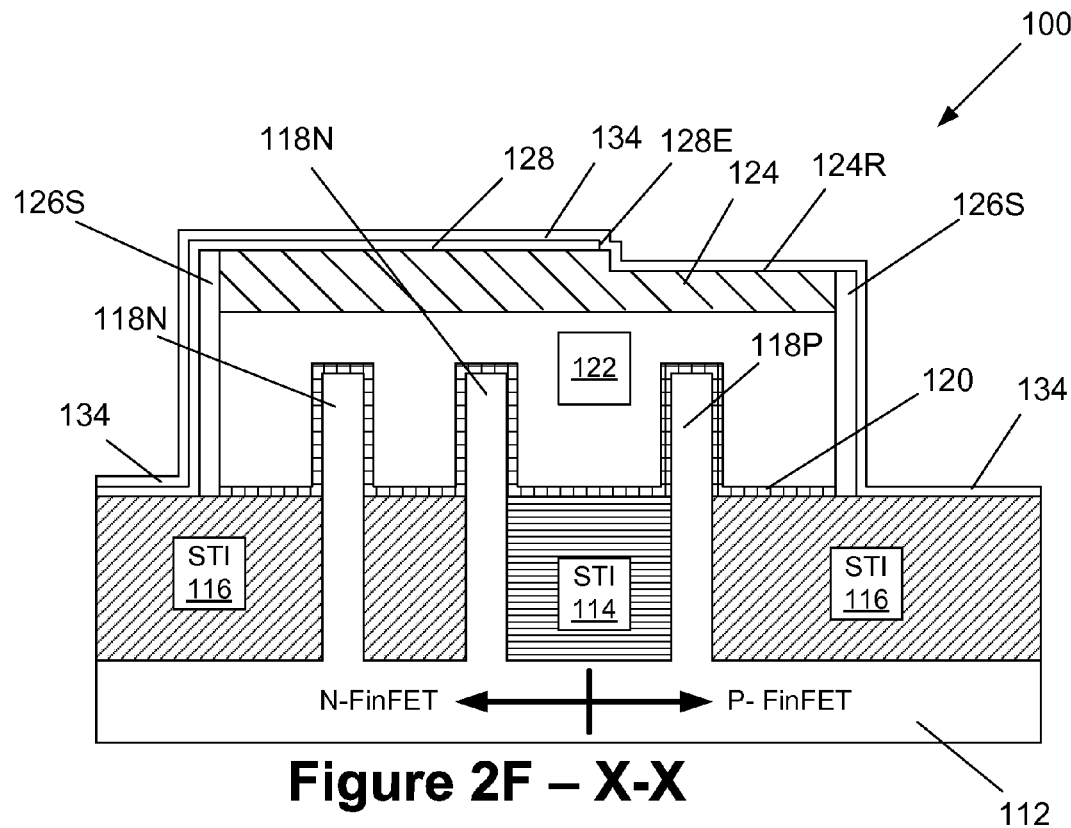
Figure 2F – X-X
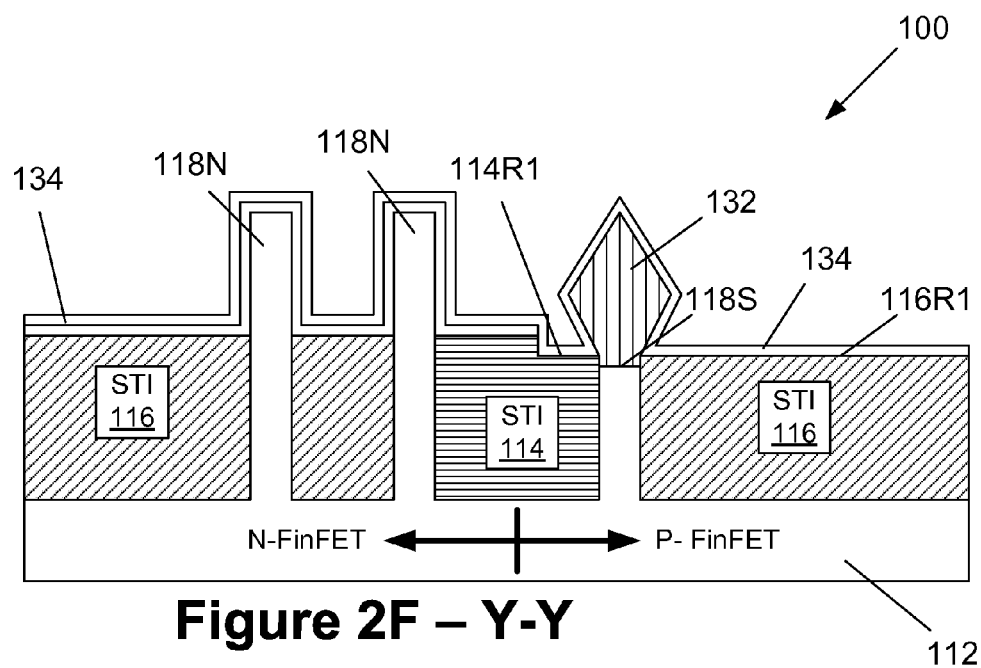
Figure 2F – Y-Y

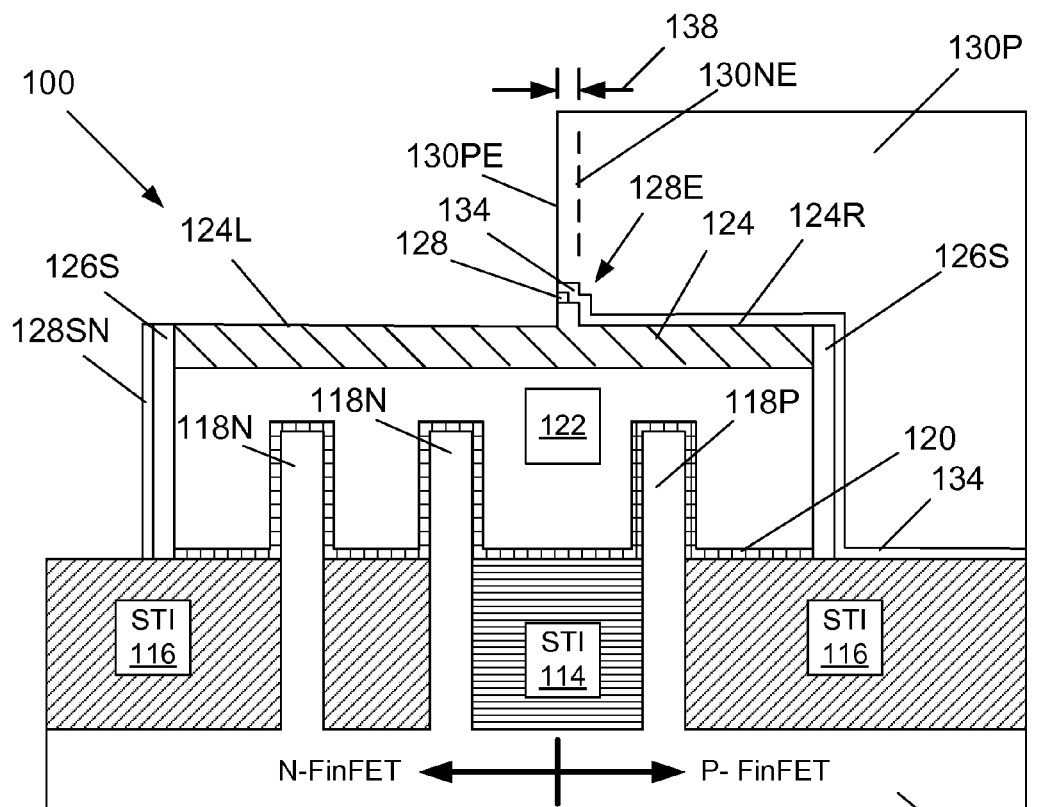
Figure 2G – X-X
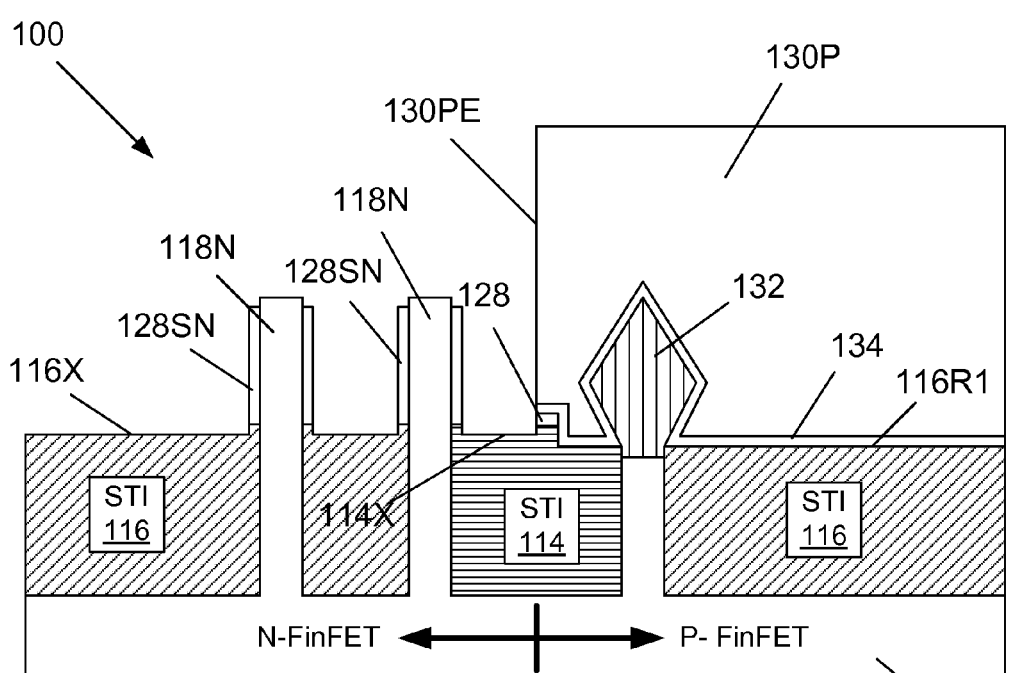
Figure 2G – Y-Y

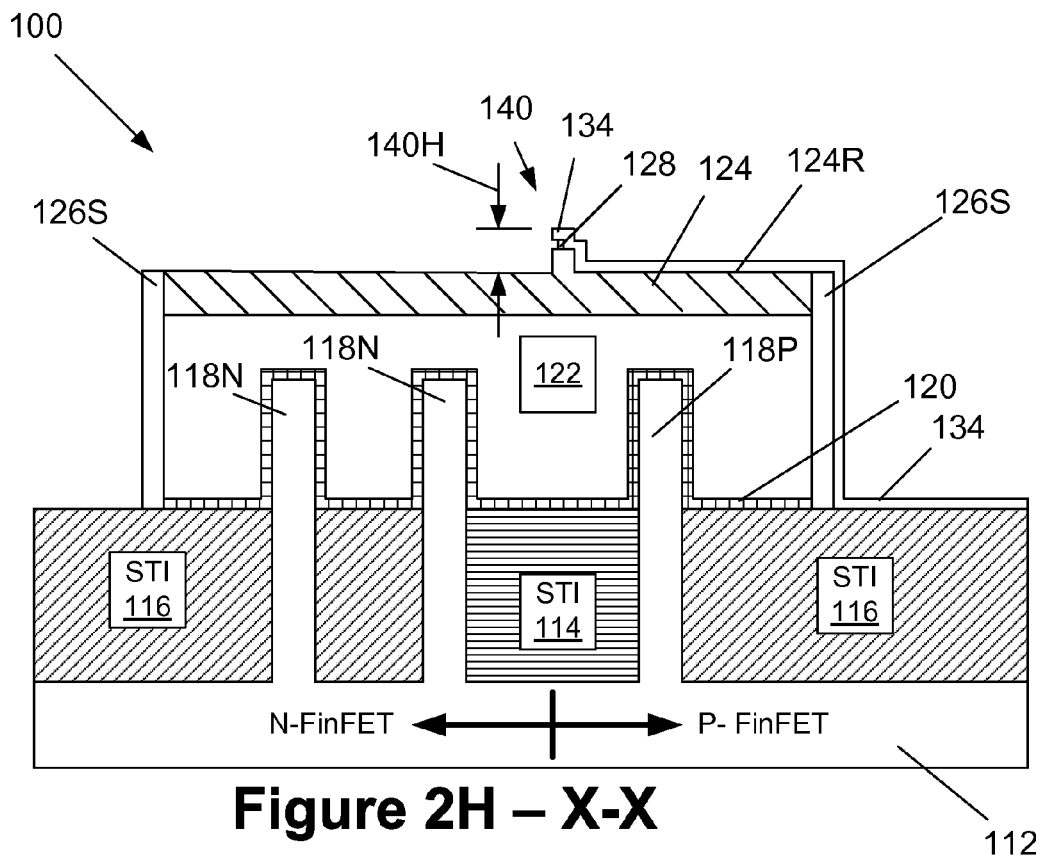
Figure 2H – X-X
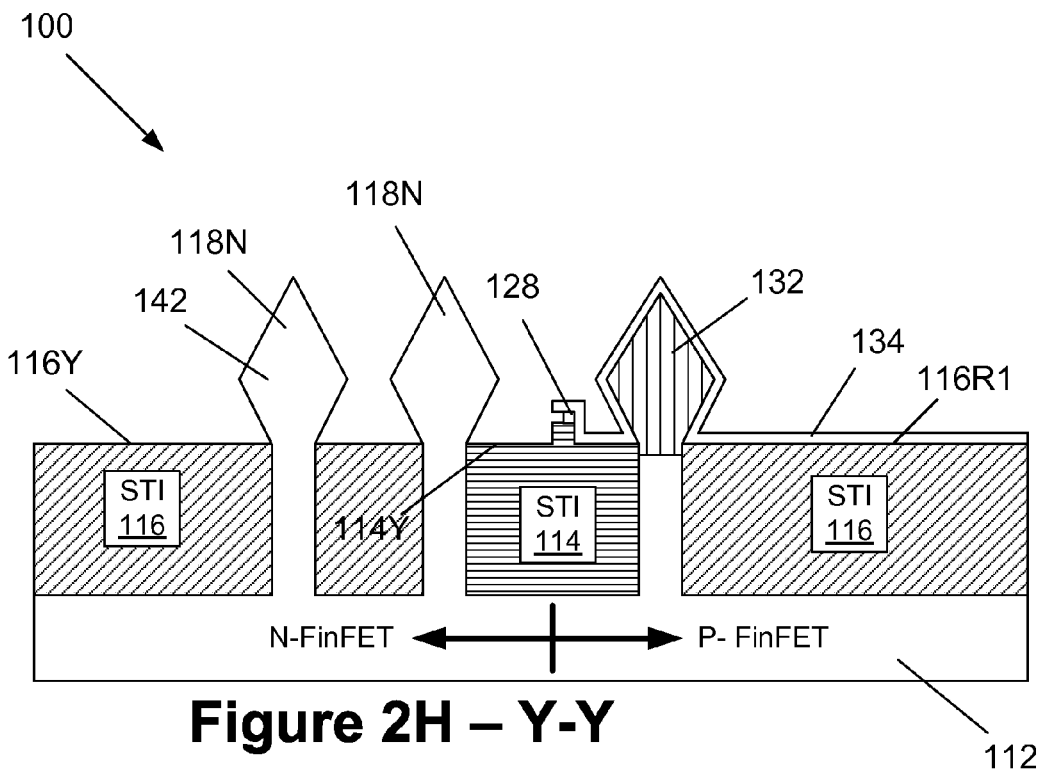
Figure 2H – Y-Y

000# METHODS OF FORMING FINFET DEVICES WITH A SHARED GATE STRUCTURE

BACKGROUND OF THE INVENTION

1. Field of the Invention

Generally, the present disclosure relates to the manufacture of sophisticated semiconductor devices, and, more specifically, to various methods of forming FinFET devices with a shared gate structure.

2. Description of the Related Art

The fabrication of advanced integrated circuits, such as CPU's, storage devices, ASIC's (application specific integrated circuits) and the like, requires the formation of a large number of circuit elements in a given chip area according to a specified circuit layout, wherein so-called metal oxide field effect transistors (MOSFETs or FETs) represent one important type of circuit element that substantially determines performance of the integrated circuits. A FET is a planar device that typically includes a source region, a drain region, a channel region that is positioned between the source region and the drain region, and a gate electrode positioned above the channel region. Current flow through the FET is controlled by controlling the voltage applied to the gate electrode. If there is no voltage applied to the gate electrode, then there is no current flow through the device (ignoring undesirable leakage currents, which are relatively small). However, when an appropriate voltage is applied to the gate electrode, the channel region becomes conductive, and electrical current is permitted to flow between the source region and the drain region through the conductive channel region.

To improve the operating speed of FETs, and to increase the density of FETs on an integrated circuit device, device designers have greatly reduced the physical size of FETs over the years. More specifically, the channel length of FETs has been significantly decreased, which has resulted in improving the switching speed of FETs. However, decreasing the channel length of a FET also decreases the distance between the source region and the drain region. In some cases, this decrease in the separation between the source and the drain makes it difficult to efficiently inhibit the electrical potential of the source region and the channel from being adversely affected by the electrical potential of the drain. This is sometimes referred to as a so-called short channel effect, wherein the characteristic of the FET as an active switch is degraded.

In contrast to a FET, which has a planar structure, a so-called FinFET device has a three-dimensional (3D) structure. More specifically, in a FinFET, a generally vertically positioned fin-shaped active area is formed and a gate electrode encloses both sides and an upper surface of the fin-shaped active area to form a tri-gate structure so as to use a channel having a three-dimensional structure instead of a planar structure. In some cases, an insulating cap layer, e.g., silicon nitride, is positioned at the top of the fin and the FinFET device only has a dual-gate structure. Unlike a planar FET, in a FinFET device, a channel is formed perpendicular to a surface of the semiconducting substrate so as to reduce the physical size of the semiconductor device. Also, in a FinFET, the junction capacitance at the drain region of the device is greatly reduced, which tends to reduce at least some short channel effects.

One problem encountered in manufacturing FinFET devices will now be described with reference to FIGS. 1A-1F. FIG. 1A is a perspective view of an illustrative FinFET semiconductor device 10 that is formed above a semiconducting substrate 12. The device 10 includes a plurality of fins 14, a gate electrode 13, sidewall spacers 17 and a gate cap layer 15. FIG. 1A depicts the locations where various cross-sectional views of the device 10 will be taken in the drawings discussed below. More specifically, view "X-X" is a cross-sectional view taken through the gate electrode 13 in a direction that is parallel to the long axis of the gate electrode 13, i.e., in the gate width direction, and view "Y-Y" is a cross-sectional view taken through the fins 14 in a direction that is transverse to the long axis of the fins 14. It should be understood that FIG. 1A is only provided to show the location of the various cross-sectional views depicted in the drawings below, and many aspects discussed below are not depicted in FIG. 1A so as to not overly complicate the device 10 depicted in FIG. 1A. Moreover, the reference numbers employed below for various structures may not match the reference numbers depicted in FIG. 1A.

FIGS. 1B-1F depict the illustrative situation where an N-type FinFET device will be formed adjacent to a P-type FinFET device, such as in an SRAM structure, and where the two devices will ultimately share a common gate structure. The N-type FinFET device is separated from the P-type FinFET device by an illustrative shallow trench isolation region 14 that is formed in the substrate 12. Illustrative STI regions 16 are also depicted. In the depicted example, the common gate structure for both devices will be formed using a so-called "replacement gate" or "gate last" technique. At the point of fabrication depicted in FIG. 1B, a plurality of fins 18N have been formed for the N-type FinFET device and a single fin 18P has been formed for the P-type FinFET device. The fins were formed by performing an etching process, such as a dry or wet etching process, through a patterned mask layer (not shown) to form a plurality of trenches 13 in the substrate 12 to thereby define the fins 18N, 18P. Also depicted in FIG. 1B is a sacrificial gate structure that is comprised of a sacrificial gate insulation layer 20, a sacrificial gate electrode 22 and a gate cap layer 24. A layer of sidewall spacer material 26 is also depicted in FIG. 1B. Such layers may be formed using a variety of different materials and by performing a variety of known techniques. For example, the sacrificial gate insulation layer 20 may be comprised of silicon dioxide, the sacrificial gate electrode layer 22 may be comprised of polysilicon or amorphous silicon, and the gate cap layer 24 may be comprised of silicon nitride. The layers of material depicted in FIG. 1B may be formed by any of a variety of different known techniques, e.g., a chemical vapor deposition (CVD) process, an atomic layer deposition (ALD) process, a thermal growth process, etc. The sacrificial gate structure may be formed by patterning the layers of material using traditional photolithography and etching processes. The gate cap layer 24 is typically relatively thick, e.g., about 60-100 nm, due to the etching processes it must withstand as the device is being fabricated, as discussed more fully below. The layer of sidewall spacer material 26 may have a thickness of about 10 nm and it may be comprised of materials such as silicon nitride, silicon oxynitride, silicon nitride carbon, etc.

FIG. 1C depicts the device after several process operations have been performed. First, a patterned etch mask 30N, e.g., a patterned photoresist mask, was formed on the device 10 so as to cover the N-type FinFET device and expose the P-type FinFET device for further processing. The patterned etch mask 30N has an edge 30NE. Thereafter, an anisotropic etching process operation was performed on the layer of sidewall spacer material 26 to thereby define a first sidewall spacer 26SP that is positioned on a first, exposed portion of the sacrificial gate structure and on the exposed fin 18P. Note that the first sidewall spacer 26SP extends around less than the entire perimeter of the sacrificial gate structure due to the presence of the mask layer 30N. One process operation that is commonly employed to form the first spacer 26SP involves performing an initial "main etch" that is non-selective in nature, and thus faster, to remove most of the thickness of the layer of spacer material 26. At some point, the main etch process is stopped and a selective "over-etch" process is performed to finish the removal of the layer of spacer material 26 and thereby define the first spacer 26SP. Importantly, the over-etch process is performed for a sufficient duration such that the fin 18P is cleared of any spacer material, as shown in FIG. 1C (view Y-Y). The exposed portion of the gate cap layer 24 is also etched or "gouged" during the formation of the spacer 26SP, as reflected by the recessed surface 24R. In some cases, as much as half of the original thickness of the gate cap layer 24 may be consumed during this process.

FIG. 1D depicts the device after several process operations have been performed. First, the masking layer 30N was removed and an epi pre-clean process was performed on the fin 18P to insure that the fin 18P is cleared of all materials that may be detrimental to the formation of an epi semiconductor material on the fin 18P, such as oxide materials, photoresist materials, etc. The epi pre-clean is typically performed using a dilute HF acid. The pre-clean process may consume a small amount of the STI region 14 and the STI region 16, but such consumption is not depicted in the drawings. After the pre-clean process was performed, an epi deposition process was performed to form a semiconductor material 32 on the fin 18P. The diamond-shaped nature of the semiconductor material 32 is due to the crystalline structure of the substrate material. Dashed line 34 depicts the outline of the original fin 18P. Thereafter, a very thin protection layer 36, e.g., 3-4 nm of silicon nitride, was conformably deposited on the device 10 so as to protect the fin 18P.

FIG. 1E depicts the device after several process operations have been performed. First, a patterned etch mask 30P, e.g., a patterned photoresist mask, was formed on the device 10 so as to cover the P-type FinFET device and expose the N-type FinFET device for further processing. The patterned etch mask 30P has an edge 30PE. Thereafter, the above-described anisotropic etching process sequence was performed on the remaining portions of the layer of sidewall spacer material 26 to thereby define a second sidewall spacer 26SN positioned on a second exposed portion of the sacrificial gate structure and on the fins 18N. As before, the over-etch process is performed for a sufficient duration such that the fins 18N are cleared of any spacer material, as shown in FIG. 1E (view Y-Y). The exposed portion of the gate cap layer 24 is also etched or "gouged" during the formation of the spacer 26SN, as reflected by the recessed surface 24L.

In forming the spacers 26SP and 26SN, it is very important that the masking layers 30N, 30P overlap to some degree. With reference to FIG. 1E (view X-X), the position of the edge 30NE of the first etch mask 30N is indicated by a dashed line. The amount of the overlap 38 is ideally very small, e.g., about 10-20 nm, but it must be sufficiently large to account for all potential misalignment errors. Without such an overlay 38, a portion of the gate cap layer 24 would be exposed to both of the etching processes performed to form the spacers 26SP and 26SN, which might consume the entire affected portion of the gate cap layer 24 thereby exposing a portion of the underlying sacrificial gate electrode 22. If the sacrificial gate electrode 22 were to be exposed, epi semiconductor material would also undesirably form on the gate electrode 22 as well during the process of forming epi material 32 on the fins 18N, as described more fully below.

FIG. 1F depicts the device after several process operations have been performed. First, the masking layer 30P was removed and an epi pre-clean process was performed on the fins 18N to insure that the fins 18N are cleared of all undesirable materials, e.g., oxide materials. After the pre-clean process was performed, an epi deposition process was performed to form a semiconductor material 42 on the fins 18N. Dashed lines 44 depict the outline of the original fins 18N. At the point of fabrication depicted in FIG. 1F, traditional manufacturing techniques may be performed to complete the manufacture of the device 10, e.g., removal of the sacrificial gate structure, formation of a replacement gate structure that contains one or more metal layers, the formation of various conductive contact structures to various regions of the device 10, etc.

One problem that results from the above process sequence is the formation of a relatively large "bump" 40, as shown in FIG. 1F. The bump 40 is typically comprised of layers of silicon nitride material, and it may have an overall height 40H of about 30-60 nm, but the total height may vary with the overlay of the two masks 30N, 30P. The presence of the bump 40 creates problems in subsequent processing operations. For example, it is very important that the uppermost surface or topography of the materials on the substrate be substantially flat or planar. Absent such planarity, errors can arise in patterning structures, such as gate electrodes, to the precise dimensions required to manufacture integrated circuit devices. Avoiding undesirable surface topography is even more important as device dimensions continue to shrink. Chemical mechanical polishing (CMP) is one technique that device manufacturers have employed for many years in an effort to achieve acceptable levels of planarity of the substrates as they are processed. However, the presence of the large bump 40 makes it difficult to achieve a substantially planar surface during a CMP process. More specifically, performing the CMP process for a sufficient duration to insure removal of the bump 40 may cause unwanted dishing in other areas of the substrate, or even exposure of other materials that were not intended to be exposed. If the bump 40 is not substantially removed, then its presence will be reflected in the subsequent removal of layers of material below the bump 40, thereby leading to problems in removing the dummy poly gate structure below the bump 40.

Another problem with the above-described process sequence is related to the very high aspect ratios that are inherent in any FinFET device. Typically, the gate structures of a FinFET device are relatively tall so that they may wrap around the fins and accommodate the use of self-aligned contacts. It is difficult to fully develop patterned photoresist masks in such a high topography environment. Additionally, the use of such under-developed photoresist masks during the etching processes that are performed to form the spacers 26SP and 26SN (which are typically made of silicon nitride), may lead to so-called "scumming"—a process whereby hydrogen outgassing from the underlying layer of silicon nitride results in photoresist material being left in undesirable areas. In general, scumming causes patterns not to etch correctly and may leave permanent parasitic spacers where the resist has polymerized. One other issue is that, as noted above, the fins must be cleared of the spacer material 26 prior to the formation of epi semiconductor material on the fins without an overconsumption of the fin material. One technique to insure this happens is to employ a relatively high oxygen flow rate during the over-etch process described above. Unfortunately, the high oxygen flow rate causes a greater consumption of the photoresist mask. Thus, the amount of over-etching that can be done (to insure the fins are cleared of silicon nitride material) is limited as it may consume too much of the photoresist mask. On the other hand, increasing the thickness of the photoresist mask to compensate for such consumption makes forming accurate photoresist masks more difficult in terms of precision of features and overlay accuracy. In short, the high aspect ratio associated with the formation of FinFET devices makes the above-described double-spacer, double-epi process flow very difficult.

The present disclosure is directed to various methods of forming FinFET devices with a shared gate structure that may solve or reduce one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure is directed to various methods of forming FinFET devices with a shared gate structure. In one example, the method disclosed herein includes forming a shared sacrificial gate structure above at least one first fin for a first type of FinFET device and at least one second fin for a second type of FinFET device, wherein the second type is opposite to the first type, and forming a first sidewall spacer around an entire perimeter of the sacrificial gate structure in a single process operation.

Another illustrative method disclosed herein includes forming a shared sacrificial gate structure above at least one first fin for a first type of FinFET device and at least one second fin for a second type of FinFET device, forming a first sidewall spacer comprised of silicon nitride around an entire perimeter of the sacrificial gate structure in a single process operation, forming a sacrificial layer comprised of silicon dioxide above the sacrificial gate structure, on the first sidewall spacer, on the at least one first fin and on the at least one second fin, forming a first etch mask above the first type of FinFET device, and performing an etching process on the sacrificial layer to define a second sidewall spacer comprised of silicon dioxide positioned on a first portion of the first sidewall spacer. In this example, the method further includes removing the first etch mask and forming a second etch mask above the second type of FinFET device and performing an etching process on the layer of insulating material to define a third sidewall spacer comprised of silicon dioxide positioned on a second portion of the first sidewall spacer.

Yet another illustrative method disclosed herein includes forming a shared sacrificial gate structure above at least one first fin for a first type of FinFET device and at least one second fin for a second type of FinFET device, forming a first sidewall spacer around an entire perimeter of the sacrificial gate structure in a single process operation, forming a sacrificial layer of insulating material above the sacrificial gate structure, on the first sidewall spacer, on the at least one first fin and on the at least one second fin, and forming a first etch mask that covers the first type of FinFET device and exposes the second type of FinFET device including the at least one second fin. In this example, the method includes the additional steps of performing an etching process through the first etch mask on the layer of insulating material to define a second sidewall spacer positioned on a first portion of the first sidewall spacer, performing an etching process to remove a portion of the at least one second fin such that the at least one second fin has a recessed surface that is positioned below an upper surface of an adjacent isolation region, and performing an epi deposition process to form a semiconductor material on the recessed surface of the at least one second fin.

BRIEF DESCRIPTION OF THE DRAWINGS

The disclosure may be understood by reference to the following description taken in conjunction with the accompanying drawings, in which like reference numerals identify like elements, and in which:

FIGS. 1A-1F depict one illustrative prior art method of forming an illustrative FinFET device using a dual spacer etch sequence; and FIGS. 2A-2H depict one illustrative method disclosed herein of forming FinFET devices with a shared gate structure.

Figure 1A:
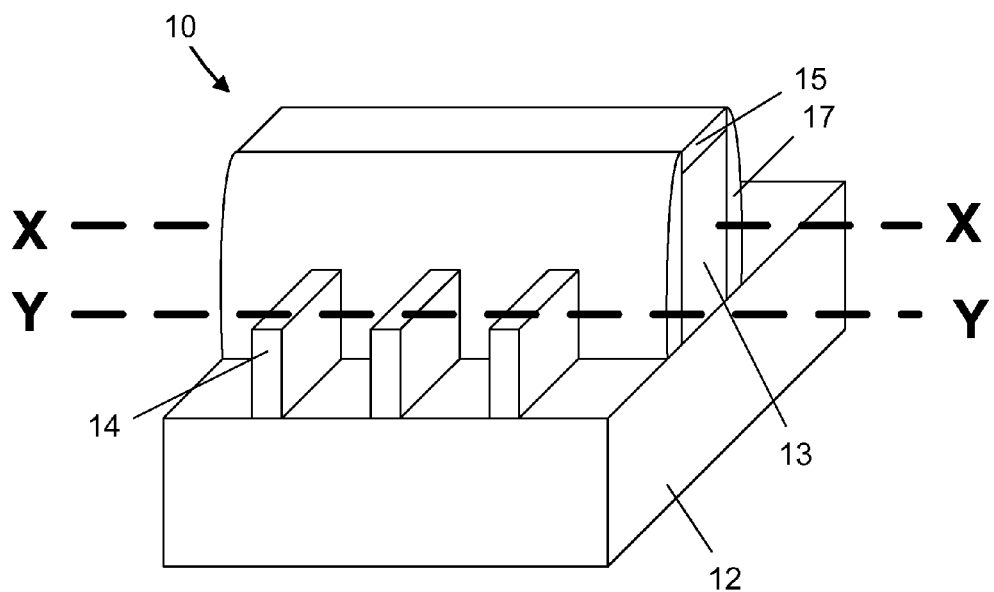

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIGS. 2A-2H depict one illustrative embodiment of one illustrative method disclosed herein for manufacturing a device 100 that is comprised of opposite type FinFET devices that share a common gate electrode. The cross-sectional view shown in FIGS. 2A-2H will be taken where indicated in FIG. 1A, i.e., view "X-X" is a cross-sectional view taken through the gate in the gate width direction and view "Y-Y" is a cross-sectional view taken through the fins in a direction that is transverse to the long axis of the fins.

FIGS. 2A-2H depict the illustrative situation where an N-type FinFET device will be formed adjacent to a P-type FinFET device, such as in an SRAM structure, and where such devices will ultimately share a common gate structure. The N-type FinFET device is separated from the P-type FinFET device by an illustrative shallow trench isolation region 114 that is formed in the substrate 112. Illustrative STI regions 116 are also depicted. The STI region 114 and the STI regions 116 may be formed using traditional techniques. The substrate 112 may have a variety of configurations, such as the depicted bulk substrate configuration, or it may have a silicon-on-insulator (SOI) configuration. The substrate 112 may be made of silicon or it may be made of materials other than silicon. Thus, the terms "substrate" or "semiconducting substrate" should be understood to cover all semiconducting materials and all forms of such materials.

In the depicted example, the gate structure for both the N-type FinFET device and the P-type FinFET device will be formed using a so-called "replacement gate" or "gate last" technique. At the point of fabrication depicted in FIG. 2A, a plurality of fins 118N have been formed for the N-type FinFET device and a single fin 118P has been formed for the P-type FinFET device. In one illustrative process flow, an etching process, such as a dry or wet etching process, was performed through a patterned mask layer (not shown) to form a plurality of trenches 113 in the substrate 112 to thereby define the fins 118N, 118P. Of course, as will be appreciated by those skilled in the art after a complete reading of the present application, the FinFET devices may be comprised of any number of fins. The overall size, shape and configuration of the trenches 113 and fins 118N, 118P may vary depending on the particular application. In the illustrative example depicted in the attached drawings, the fins 118N, 118P all have a uniform size and shape. However, as discussed more fully below, such uniformity in the size and shape of the fins 118N, 118P is not required to practice at least some aspects of the inventions disclosed herein. In the example depicted herein, the trenches 113 were formed by performing an anisotropic etching process that results in the trenches 113 having a schematically depicted, generally rectangular configuration. In an actual real-world device, the sidewalls of the trenches 113 may be somewhat inwardly tapered, although that configuration is not depicted in the drawings. Thus, the size and configuration of the trenches 113, and the manner in which they are made, should not be considered a limitation of the present invention. For ease of disclosure, only the substantially rectangular trenches 113 will be depicted in subsequent drawings.

Also depicted in FIG. 2A is a sacrificial gate structure that is comprised of a sacrificial gate insulation layer 120, a sacrificial gate electrode 122 and a gate cap layer 124. A layer of sidewall spacer material 126 is also depicted in FIG. 2A. Such layers may be formed using a variety of different materials and by performing a variety of known techniques. For example, the sacrificial gate insulation layer 120 may be comprised of silicon dioxide, and the sacrificial gate electrode layer 122 may be comprised of polysilicon or amorphous silicon. The gate cap layer 124 may be comprised of silicon nitride and it may be formed to a thickness within the range of about 40-60 nm when using the novel process flow described herein. In one illustrative embodiment, the gate cap layer 124, with a thickness of about 40-60 nm, is significantly thinner than the gate cap layer 24 discussed in the background section of this application, which had a typical thickness of about 60-100 nm. The layers of material depicted in FIG. 2A may be formed by any of a variety of different known techniques, e.g., a chemical vapor deposition (CVD) process, an atomic layer deposition (ALD) process, a thermal growth process, etc. The sacrificial gate structure may be formed by patterning the various layers of material that are used in the sacrificial gate structure using traditional photolithography and etching processes. The layer of sidewall spacer material 126 may have a thickness of about 10 nm and it may be comprised of materials such as silicon nitride, silicon oxynitride, silicon nitride carbon, etc.

FIG. 2B depicts the device 100 after a single anisotropic etching process operation was performed on the layer of sidewall spacer material 126 to thereby define a first sidewall spacer 126S that extends around the entire perimeter of the sacrificial gate structure. In one embodiment, the single etching process operation involves performing an initial "main etch" that is non-selective in nature, and thus faster, to remove most of the thickness of the layer of spacer material 126. At some point, the main etch process is stopped and a selective "over-etch" process is performed to finish the removal of the layer of spacer material 126 and thereby define the first spacer 126S. Importantly, the over-etch process is performed for a sufficient duration such that the fins 118N, 118P are cleared of any spacer material, as shown in FIG. 2B (view Y-Y). The gate cap layer 124 is also etched during the formation of the spacer 126S, as reflected by the etched surface 124E. In some cases, as much as half of the original thickness of the gate cap layer 124 may be consumed during this process. If desired, the first spacer 126S may be formed by performing a single etching process, i.e., by performing only the over-etch portion of the above-described sequence. Thus, when the phrase "single process operation" is used herein and in the claims with reference to the formation of the first spacer 126S, it should be understood to include either single or multi-step etching processes.

FIG. 2C depicts the device 100 after a layer of insulating material 128, e.g., silicon dioxide, is conformably deposited on the device 100. In one illustrative embodiment, the layer of insulating material 128 may be a layer of silicon dioxide with a thickness of about 7-15 nm that is formed by performing a conformal CVD or ALD process. As described more fully below, the layer of insulating material 128 and the spacers that will be formed from the layer of insulating material 128 are sacrificial in nature.

FIG. 2D depicts the device 100 after several process operations have been performed. First, a patterned etch mask 130N, e.g., a patterned photoresist mask, was formed on the device 100 so as to cover the N-type FinFET device and expose the P-type FinFET device for further processing. The patterned etch mask 130N has an edge 130NE. Thereafter, an anisotropic etching process was performed on the layer of insulating material 128 to thereby define a second sidewall spacer 128SP that is positioned on a first exposed portion of the first sidewall spacer 126S (the portion exposed by the mask 130N) and on the exposed fin 118P. Note that the second sidewall spacer 128SP does not extend around the entire perimeter of the sacrificial gate structure due to the presence of the mask 130N. If desired, the previously described "main etch" and "over-etch" process sequence may be employed to form the spacer 128SP, or a single etching process may be performed to define the second spacer 128SP. In some cases, depending upon the etching process, the spacer 128SP may not be present adjacent the fins 118P. During this etching process, the exposed portion of the gate cap layer 124 is also etched or "gouged" during the formation of the spacer 128SP, as reflected by the recessed surface 124R. However, using the novel methods disclosed herein where the layer of insulating material 128 is made of silicon dioxide while the cap layer 124 is made of silicon nitride, the amount of the cap layer 124 that is consumed during the etching process that is performed to form the spacer 128SP is much less than was consumed when the prior art cap layer 24 was exposed to the etching process used to form the spacer 26SP, since the spacer 26SP was made of silicon nitride—i.e., the prior art spacer material was the same as the material of the prior art gate cap layer 24. In some cases, in forming the silicon dioxide spacers 128SP, only about 2-3 nm of the silicon nitride cap layer 124 may be removed during this etching process. As indicated in FIG. 2D, view Y-Y, the etching process that was performed to form the silicon dioxide spacer 128SP may also consume about 3-4 nm of the exposed portions of the STI region 114 and the STI region 116. This is reflected by the recessed surfaces 114R, 116R, respectively, shown in FIG. 2D. Also note that, in this illustrative process flow, various process operations have initially been performed on the P-type FinFET device. However, as will be appreciated by those skilled in the art after a complete reading of the present application, the process flow could be altered such that the process operation described herein as being performed on the P-type FinFET device could be initially formed on the N-type FinFET device.

FIG. 2E depicts the device 100 after an etching process has been performed to remove an upper portion of the fin 118P, which now has a recessed surface 118S. The amount of recessing of the fin 118P may vary depending on the particular application. In one illustrative embodiment, the recessed surface 118S of the fin 118P may be positioned about 5-20 nm below the bottom surface 122S of the sacrificial gate electrode 122.

FIG. 2F depicts the device 100 after several process operations have been performed. First, the masking layer 130N was removed and an epi pre-clean process was performed on the fin 118P to insure that the fin 118P is cleared of all undesirable materials. The epi pre-clean process is typically performed using a dilute HF acid. The epi pre-clean process removes the second spacer 128SP and consumes an additional amount of the STI region 114 and the STI region 116, e.g., about 7-9 nm, as reflected by the surfaces 114R1, 116R1, respectively. The pre-clean process also recesses an end 128E of the layer of insulating material 128. After the pre-clean process was performed, an epi deposition process was performed to form a semiconductor material 132 on the recessed surface 118S of the fin 118P. Thereafter, a very thin protection layer 134, e.g. 2-3 nm of silicon nitride, was conformably deposited on the device 100 so as to protect the fin 118P.

FIG. 2G depicts the device 100 after several process operations have been performed. First, a patterned etch mask 130P, e.g., a patterned photoresist mask, was formed on the device 100 so as to cover the P-type FinFET device and expose the N-type FinFET device for further processing. The patterned etch mask 130P has an edge 130PE. Thereafter, an etching process, such as a wet etching process, was performed to selectively remove exposed portions of the silicon nitride layer 134 relative to the silicon dioxide layer 128. Then, an anisotropic etching process was performed on the layer of insulating material 128 to thereby define a third sidewall spacer 128SN that is positioned on the second portion of the first sidewall spacer 126S and on the exposed fins 118N. Note that the third sidewall spacer 128SN does not extend around the entire perimeter of the sacrificial gate structure due to the presence of the mask 130P. If desired, the previously described "main etch" and "over-etch" process sequence may be employed to form the spacer 128SN. In some cases, depending upon the etching process, the spacer 128SN may not be present adjacent the fins 118N. A single etching process may also be performed to form the third spacer 128SN. During this etching process, the exposed portion of the gate cap layer 124 is also etched or "gouged" during the formation of the spacer 128SN, as reflected by the recessed surface 124L. However, as noted above, the amount of the cap layer 124 that is consumed is less relative to the prior art cap layer 24 described in the background section of this application. Using the methods disclosed herein, much less of the cap layer 124 is consumed because the etching process that was performed to form the spacers 128SN is one that is directed to the removal of silicon dioxide material selectively relative to the underlying silicon nitride materials, e.g., the gate cap layer 124, i.e., the etching process does not attack the gate cap layer 124 as much. In some cases, in forming the spacers 128SN, only about 2-3 nm of the cap layer 124 may be removed during this etching process. As indicated in FIG. 2G, view Y-Y, the etching process that was performed to form the spacer 128SN may also consume about 3-4 nm of the exposed portions of the STI region 114 and the STI region 116. This is reflected by the recessed surfaces 114X, 116X, respectively, shown in FIG. 2G.

In forming the spacers 128SP and 128SN, it is very important that the masking layers 130N, 130P overlap to some degree. With reference to FIG. 2G (view X-X), the position of the edge 130NE of the first etch mask 130N is indicated by a dashed line. The amount of the overlap 138 is ideally very small, e.g., about 10-20 nm, but it must be sufficiently large to account for all potential misalignment errors. However, since the gate cap layer 124 is only exposed to one etch process to form the first spacer 126S made of a similar material, e.g., where the gate cap layer 124 and the first spacer 126S are both made of silicon nitride, the original thickness of the gate cap layer 124 can be reduced. Moreover, the amount of gouging of the gate cap layer 124 during the etching processes used to form the spacers 128SP, 128SN is much less since they are made of a material other than the material of the gate cap layer 124, e.g., the spacers 128SP, 128SN may be made of silicon dioxide while the gate cap layer 124 is made of silicon nitride.

FIG. 2H depicts the device 100 after several process operations have been performed. First, the masking layer 130P was removed and an epi pre-clean process was performed on the fins 118N to insure that the fins 118N are cleared of all undesirable materials. The epi pre-clean process is typically performed using a dilute HF acid. The epi pre-clean process removes the third sidewall spacer 128SN and consumes an additional amount of the STI region 114 and the STI region 116, e.g., about 7-9 nm, as reflected by the surfaces 114Y, 116Y, respectively. The pre-clean process also recesses the remaining portions of the layer of insulating material 128. After the pre-clean process was performed, an epi deposition process was performed to form a semiconductor material 142 on the fins 118N.

Although the process sequence described above still results in the formation of an illustrative bump 140 of silicon nitride material, the overall height of the bump 140 may be much smaller than the bump 40 described in the background section of this application. For example, the bump 140 may have an overall height 140H of about 3-7 nm. The reduction in the size of the bump 140 resulting from the process flow described above makes subsequent CMP processing operations easier to perform and more likely to achieve acceptable results in terms of flatness.

At the point of fabrication depicted in FIG. 2H, traditional manufacturing techniques may be performed to complete the manufacture of the device 100, e.g., removal of the sacrificial gate structure, formation of a replacement gate structure that contains one or more metal layers, the formation of various conductive contact structures to various regions of the device 100, etc. The gate insulation layer of the replacement gate structure of the device 100 may be comprised of a variety of different materials, such as, for example, a so-called high-k (k greater than 10) insulation material (where k is the relative dielectric constant), etc. The gate electrode of the replacement gate structure may also be of one or more conductive materials, such as polysilicon or amorphous silicon, or it may be comprised of one or more metal layers that act as the gate electrode.

The particular embodiments disclosed above are illustrative only, as the invention may be modified and practiced in different but equivalent manners apparent to those skilled in the art having the benefit of the teachings herein. For example, the process steps set forth above may be performed in a different order. As an example, the first nitride spacer may be etched with a mask, followed by forming an oxide hardmask to protect the first epitaxial growth from the second epitaxial growth. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a shared sacrificial gate structure above at least one first fin for a first type of FinFET device and at least one second fin for a second type of FinFET device, said second type being opposite to said first type; and
    forming a first sidewall spacer around an entire perimeter of said shared sacrificial gate structure in a single deposition process operation and a single etching process operation.

2. The method of claim 1, further comprising forming a sacrificial layer of insulating material above said shared sacrificial gate structure, on said first sidewall spacer, on said at least one first fin and on said at least one second fin.

3. The method of claim 2, further comprising:
    forming a first etch mask above said first type of FinFET device and performing an etching process on said sacrificial layer of insulating material to define a second sidewall spacer positioned on a first portion of said first sidewall spacer;
    removing said first etch mask; and
    forming a second etch mask above said second type of FinFET device and performing an etching process on said sacrificial layer of insulating material to define a third sidewall spacer positioned on a second portion of said first sidewall spacer.

4. The method of claim 1, wherein said first type of FinFET device is an N-type FinFET device and said second type of FinFET device is a P-type FinFET device.

5. The method of claim 1, wherein said first type of FinFET device is a P-type FinFET device and said second type of FinFET device is an N-type FinFET device.

6. The method of claim 1, wherein said sacrificial gate structure is comprised of a layer of silicon dioxide and a layer of polysilicon positioned above said layer of silicon dioxide.

7. The method of claim 1, wherein said first sidewall spacer is comprised of silicon nitride, silicon oxynitride or silicon nitride carbon, and said sacrificial layer of insulating material is comprised of silicon dioxide.

8. The method of claim 1, wherein said step of forming said first sidewall spacer in the single deposition process operation and the single etching process operation comprises performing a multi-step etching sequence comprised of a main etch period and an over-etch period.

9. A method, comprising:
    forming a shared sacrificial gate structure above at least one first fin for a first type of FinFET device and at least one second fin for a second type of FinFET device, said second type being opposite to said first type;
    forming a first sidewall spacer comprised of silicon nitride around an entire perimeter of said shared sacrificial gate structure in a single deposition process operation and a single etching process operation;
    forming a sacrificial layer comprised of silicon dioxide above said shared sacrificial gate structure, on said first sidewall spacer, on said at least one first fin and on said at least one second fin;
    forming a first etch mask above said first type of FinFET device and performing an etching process on said sacrificial layer to define a second sidewall spacer comprised of silicon dioxide positioned on a first portion of said first sidewall spacer;
    removing said first etch mask; and
    forming a second etch mask above said second type of FinFET device and performing an etching process on said sacrificial layer to define a third sidewall spacer comprised of silicon dioxide positioned on a second portion of said first sidewall spacer.

10. The method of claim 9, further comprising performing an etching process to remove said second and third sidewall spacers.

11. The method of claim 10, further comprising performing an epitaxial deposition process to form a semiconducting material on said at least one second fin.

12. A method, comprising:
    forming a shared sacrificial gate structure above at least one first fin for a first type of FinFET device and at least one second fin for a second type of FinFET device, said second type being opposite to said first type;
    forming a first sidewall spacer around an entire perimeter of said shared sacrificial gate structure in a single deposition process operation and a single etching process operation;
    forming a sacrificial layer of insulating material above said shared sacrificial gate structure, on said first sidewall spacer, on said at least one first fin and on said at least one second fin;
    forming a first etch mask that covers said first type of FinFET device and exposes said second type of FinFET device including said at least one second fin;
    performing an etching process through said first etch mask on said sacrificial layer of insulating material to define a second sidewall spacer positioned on a first portion of said first sidewall spacer;
    performing an etching process to remove a portion of said at least one second fin such that said at least one second fin has a recessed surface that is positioned below an upper surface of an adjacent isolation region; and
    performing an epi deposition process to form a semiconductor material on said recessed surface of said at least one second fin.

13. The method of claim 12, wherein said first type of FinFET device is an N-type FinFET device and said second type of FinFET device is a P-type FinFET device.

14. The method of claim 12, wherein said first type of FinFET device is a P-type FinFET device and said second type of FinFET device is an N-type FinFET device.

15. The method of claim 12, wherein said shared sacrificial gate structure is comprised of a layer of silicon dioxide and a layer of polysilicon positioned above said layer of silicon dioxide.

16. The method of claim 12, wherein said first sidewall spacer is comprised of silicon nitride, silicon oxynitride or silicon nitride carbon, and said sacrificial layer of insulating material is comprised of silicon dioxide.

17. The method of claim 12, wherein said step of forming said first sidewall spacer in the single deposition process operation and the single etching process operation comprises performing a multi-step etching sequence comprised of a main etch period and an over-etch period.

* * * * *